(12) United States Patent
Ku et al.

(10) Patent No.: US 11,908,911 B2
(45) Date of Patent: Feb. 20, 2024

(54) THIN FILM TRANSISTORS WITH RAISED SOURCE AND DRAIN CONTACTS AND PROCESS FOR FORMING SUCH

(71) Applicant: Intel Corporation, Santa Clara, CA (US)

(72) Inventors: Chieh-Jen Ku, Hillsboro, OR (US); Bernhard Sell, Portland, OR (US); Pei-Hua Wang, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1107 days.

(21) Appl. No.: 16/414,481

(22) Filed: May 16, 2019

(65) Prior Publication Data

US 2020/0365701 A1 Nov. 19, 2020

(51) Int. Cl.
*H01L 29/423* (2006.01)
*H01L 29/66* (2006.01)
*H01L 29/45* (2006.01)
*H01L 29/786* (2006.01)

(52) U.S. Cl.
CPC ........ *H01L 29/42356* (2013.01); *H01L 29/45* (2013.01); *H01L 29/66742* (2013.01); *H01L 29/786* (2013.01)

(58) Field of Classification Search
CPC .............. H01L 29/42356; H01L 29/45; H01L 29/66742; H01L 29/786; H01L 29/42384; H01L 29/41733
See application file for complete search history.

(56) References Cited

U.S. PATENT DOCUMENTS

| | | | | |
|---|---|---|---|---|
| 4,814,836 A | * | 3/1989 | Thompson | H01L 31/1129 257/187 |
| 4,916,090 A | * | 4/1990 | Motai | H01L 29/66765 257/349 |
| 5,459,343 A | * | 10/1995 | Seymour | H01L 29/808 257/664 |
| 7,635,616 B2 | * | 12/2009 | Deng | H01L 27/1288 438/149 |
| 7,808,596 B2 | * | 10/2010 | Zhang | G02F 1/136213 349/143 |
| 7,916,230 B2 | * | 3/2011 | Qiu | G02F 1/1368 257/354 |
| 8,816,346 B2 | * | 8/2014 | Wang | H01L 27/1214 257/E21.414 |

(Continued)

FOREIGN PATENT DOCUMENTS

| | | | | | |
|---|---|---|---|---|---|
| CN | 106537600 A | * | 3/2017 | ............. | G11C 17/16 |
| CN | 108666223 A | * | 10/2018 | ........... | H01L 29/401 |

(Continued)

*Primary Examiner* — Mohammed Shamsuzzaman
(74) *Attorney, Agent, or Firm* — Schwabe, Williamson & Wyatt, P.C.

(57) ABSTRACT

A device is disclosed. The device includes a source contact in a source contact trench and a drain contact in a drain contact trench, a channel under the source contact and the drain contact, a first spacing layer on a bottom of the source contact trench and a second spacing layer on a bottom of the drain contact trench. The first spacing layer and the second spacing layer are on the surface of the channel. The device also includes a gate electrode below the channel and a dielectric above the gate electrode and underneath the channel.

13 Claims, 11 Drawing Sheets

(56) References Cited

U.S. PATENT DOCUMENTS

| | | | |
|---|---|---|---|
| 9,368,572 B1* | 6/2016 | Cheng | H01L 29/6653 |
| 10,629,746 B2* | 4/2020 | Yu | H01L 29/786 |
| 11,177,386 B2* | 11/2021 | Cao | H01L 29/78669 |
| 11,437,273 B2* | 9/2022 | Shusterman | H01L 29/4958 |
| 2004/0232408 A1* | 11/2004 | Heeger | H10K 10/474 |
| | | | 257/E21.01 |
| 2006/0046335 A1* | 3/2006 | Sarma | H01L 29/66765 |
| | | | 257/E21.414 |
| 2008/0105873 A1* | 5/2008 | Wang | H01L 27/1248 |
| | | | 257/E21.414 |
| 2011/0278583 A1* | 11/2011 | Hayashi | H01L 29/66765 |
| | | | 257/E29.292 |
| 2012/0282746 A1* | 11/2012 | Hebert | H01L 29/66689 |
| | | | 438/270 |
| 2013/0187161 A1* | 7/2013 | Yamazaki | H01L 29/78609 |
| | | | 438/158 |
| 2014/0098315 A1* | 4/2014 | Jung | G02F 1/1368 |
| | | | 349/42 |
| 2014/0374739 A1* | 12/2014 | Chang | H01L 29/42384 |
| | | | 257/43 |
| 2015/0155368 A1* | 6/2015 | Ahmed | H01L 29/66765 |
| | | | 438/158 |
| 2016/0163850 A1* | 6/2016 | Liu | H01L 29/41758 |
| | | | 257/338 |
| 2017/0170298 A1* | 6/2017 | Balakrishnan | H01L 29/7827 |
| 2017/0323957 A1* | 11/2017 | Yamazaki | H01L 21/46 |
| 2018/0026135 A1* | 1/2018 | Balakrishnan | H01L 29/78642 |
| | | | 257/329 |
| 2018/0231849 A1* | 8/2018 | Wei | H01L 27/127 |
| 2018/0337256 A1* | 11/2018 | Anderson | H01L 29/41741 |
| 2019/0214343 A1* | 7/2019 | Lee | H01L 29/66666 |
| 2020/0052079 A1* | 2/2020 | Li | H01L 29/66666 |
| 2020/0075775 A1* | 3/2020 | Xu | H01L 29/6656 |
| 2020/0098929 A1* | 3/2020 | Song | H01L 29/518 |
| 2020/0105892 A1* | 4/2020 | Haratipour | H01L 23/5329 |
| 2020/0144285 A1* | 5/2020 | Lee | H01L 27/1157 |
| 2020/0152635 A1* | 5/2020 | Sharma | H01L 29/66765 |
| 2020/0266289 A1* | 8/2020 | Yamazaki | H01L 21/02274 |
| 2020/0312842 A1* | 10/2020 | Keech | H01L 29/167 |
| 2020/0335614 A1* | 10/2020 | Chen | H01L 29/7606 |
| 2020/0373413 A1* | 11/2020 | Song | H01L 21/0332 |
| 2020/0388685 A1* | 12/2020 | Sharma | H01L 29/66795 |
| 2020/0403076 A1* | 12/2020 | Ku | H01L 29/78636 |
| 2021/0083122 A1* | 3/2021 | Naylor | H10B 41/27 |
| 2021/0098597 A1* | 4/2021 | Xie | H01L 29/7827 |
| 2021/0234011 A1* | 7/2021 | Liu | H01L 29/78666 |
| 2021/0242091 A1* | 8/2021 | Jun | H01L 29/66666 |
| 2021/0273063 A1* | 9/2021 | Wu | H01L 29/6656 |
| 2021/0296316 A1* | 9/2021 | Zhu | H01L 29/045 |
| 2021/0296494 A1* | 9/2021 | Xie | H01L 27/0924 |
| 2022/0140126 A1* | 5/2022 | LaRoche | H01L 29/7786 |
| | | | 257/183 |

FOREIGN PATENT DOCUMENTS

| | | | | |
|---|---|---|---|---|
| CN | 111370487 A | * | 7/2020 | H01L 29/66765 |
| EP | 3754724 A1 | * | 12/2020 | H01L 27/108 |
| EP | 4086938 A2 | * | 11/2022 | H01L 21/02565 |
| JP | 2002026326 A | * | 1/2002 | H01L 29/66765 |
| WO | WO-2005106960 A1 | * | 11/2005 | H01L 29/78618 |

* cited by examiner

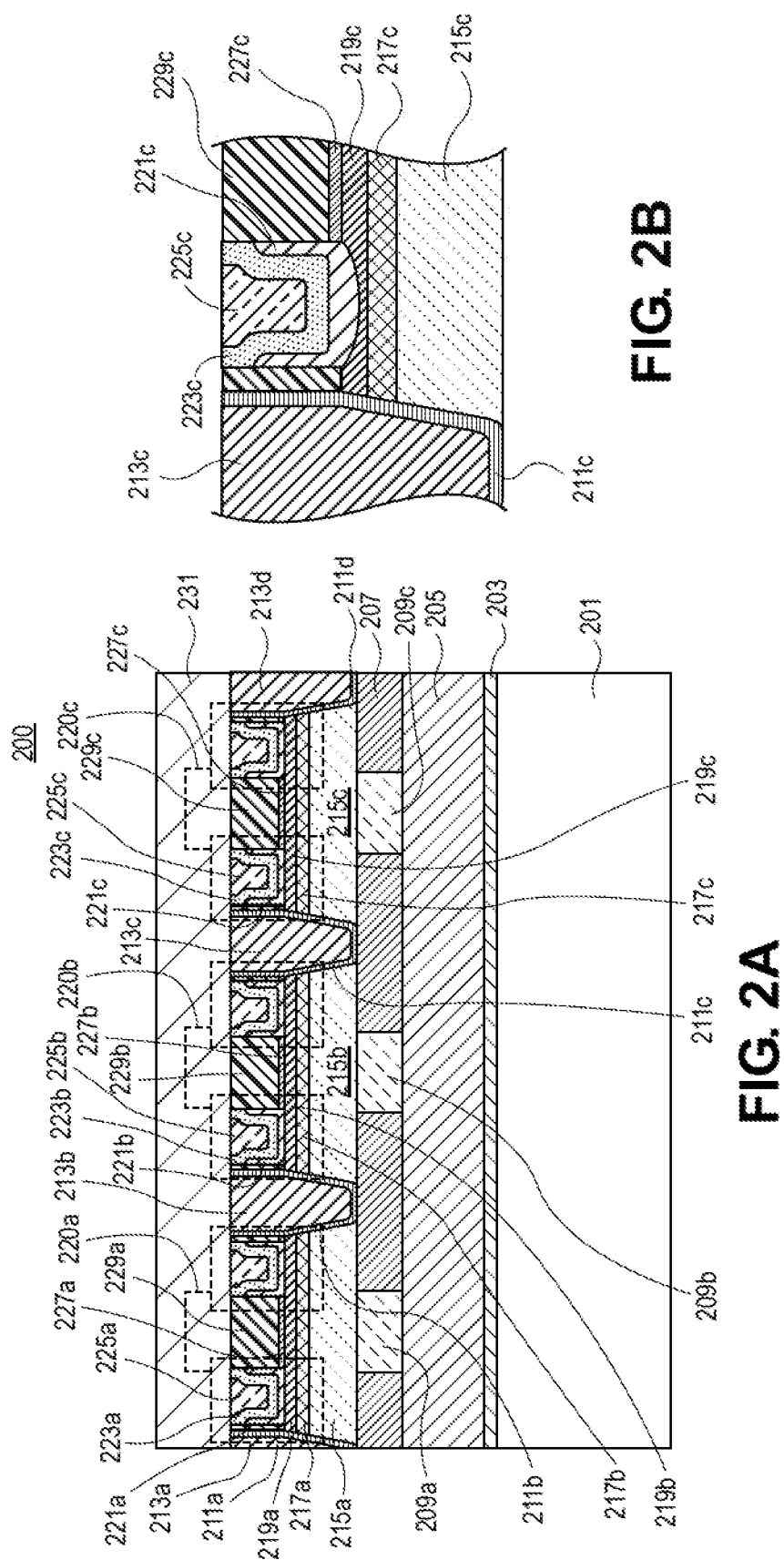

US 11,908,911 B2

THIN FILM TRANSISTORS WITH RAISED SOURCE AND DRAIN CONTACTS AND PROCESS FOR FORMING SUCH

TECHNICAL FIELD

Embodiments of the disclosure pertain to thin film transistors and, in particular, to thin film transistors with raised source and drain contacts.

BACKGROUND

Some current embedded semiconductor oxide thin film transistors are configured to include a bottom gate and a top source-drain contact structure. The vertical overlap area between the source-to-gate and the drain-to-gate regions can introduce harmful overlap capacitance (Cgs and Cgd). This overlap or parasitic capacitance can be a source of delay for the transistor.

BRIEF DESCRIPTION OF THE DRAWINGS

FIG. 2A illustrates a semiconductor structure that includes thin film transistors with raised source and drain contacts according to an embodiment.

FIG. 2B illustrates an enlarged view of the left-side source-drain contact of a source-drain contact shown in FIG. 2A according to an embodiment.

DESCRIPTION OF THE EMBODIMENTS

Figures 1A, 1B:
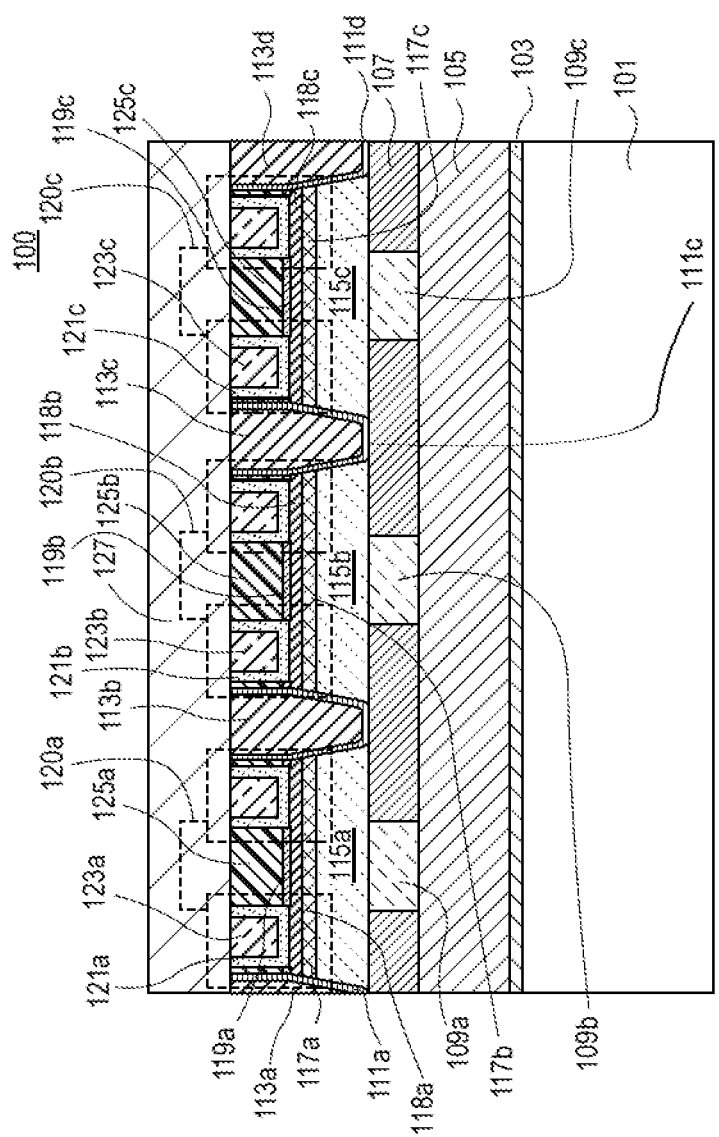
FIG. 1A illustrates a semiconductor structure that includes embedded oxide thin film transistors of a previous approach according to an embodiment.
FIG. 1B illustrates an enlarged view of a left-side source-drain contact of a source-drain contact shown in FIG. 1A according to an embodiment.

Thin film transistors with raised source and drain contacts are described. It should be appreciated that although embodiments are described herein with reference to example thin film transistors with raised source and drain contacts implementations, the disclosure is more generally applicable to thin film transistors with raised source and drain contacts implementations as well as other type thin film transistors with raised source and drain contacts implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In some previous approaches embedded semiconductor oxide thin film transistors are configured to include a bottom gate and a top source-drain contact structure. The vertical overlap area between the source-to-gate and the drain-to-gate regions that can result in transistors configured in this manner can introduce harmful overlap capacitance (Cgs and Cgd). This overlap or parasitic capacitance can be a source of delay for the transistor.

An approach that addresses the shortcomings of previous approaches is disclosed and described herein. For example, as part of a disclosed process, an additional oxide semiconductor or oxide insulator is formed in contact holes after the opening of the contact holes and before the depositing of contact material. This approach prevents the vertical overlapping of the area between the source-to-gate and the drain-to-gate regions. Moreover, it reduces overlap capacitance and contact resistivity to improve transistor performance.

In an embodiment, after contact holes have been opened, additional oxide semiconductor material is deposited directly on top of the active channel layer, the contact holes are filled with sacrificial material, and an etch is performed to partially remove sacrificial material inside the contact holes and expose some oxide semiconductor material. The exposed oxide semiconductor material is then removed selectively. Thereafter, all of the sacrificial material is removed and the contact metal layers are deposited. Subsequently, a chemical-mechanical-planarization (CMP) process is performed to polish the contact metal layers down to a target depth. In other embodiments, other operations and/or materials can be used.

FIG. 1A illustrates a semiconductor structure 100 that includes embedded oxide thin film transistors of a previous approach. In FIG. 1A, the semiconductor structure 100 includes dielectric layer 101, barrier layer 103, interconnect layer 105, etch stop layer 107, conductor vias 109a-109c, spacers 111a-111d, isolation dielectric structures 113a-113d, gate electrodes 115a-115c, gate dielectric layers 117a-117c, channel region 118a-118c, thin dielectric layers 119a-119c, first source-drain contact layer 121a-121c, second source-drain contact layer 123a-123c, and interlayer dielectric (ILD) regions 125a-125c.

Referring to FIG. 1A, the dielectric layer 101 is shown at the base of the thin film transistor 100. The barrier layer 103 is formed above the dielectric layer 101. The interconnect layer 105 is formed over the barrier layer 103. The etch stop layer 107 is formed over the interconnect layer 105. The conductor vias 109a-109c are formed in the etch stop layer 107 and above the interconnect layer 105. The gate electrodes 115a-115c are formed above the etch stop layer 107 and above the conductor vias 109a-109c. The isolation dielectric structures 113a-113d extend downward from the upper part of the transistor structure and separates gate electrodes 115a-115c (and active regions of the structure). The spacers 111a-111d surround the isolation dielectric structures 113a-113d. The gate dielectric layers 117a-117c are formed above the gate electrodes 115a-115c. The channel regions 118a-118c are formed above the gate electrodes 115a-115c. The thin dielectric layers 119a-119c are formed above the channel regions 118a-118c and below portions of the ILD regions 125a-125c that are located between the source and drain contact pairs 120a-120c (hereinafter source-drain contacts) identified by the dashed boxes in FIG. 1A. The source-drain contacts 120a-120c include the first source-drain contact layers 121a-121c and the second source-drain contact layers 123a-123c. The first source-drain contact layers 121a-121c line the spaces formed in ILD regions 125a-125c for the source-drain contacts 120a-120c. The second source-drain contact layers 123a-123c are formed on the first source-drain contact layers 121a-121c. The ILD regions 125a-125c cover each side of the source-drain contacts 120a-120c. The sacrificial dielectric 127 is formed across the top of the structure above the source-drain contacts 120a-120c, the ILD regions 125a-125c and the isolation dielectric structures 113a-113d.

In operation, because of depressions in the channel material that are formed during fabrication of the transistors shown in FIG. 1A, the source-drain contacts 120a-120c can extend downward into the channel regions 118a-118c in a manner that causes an undesirable parasitic overlap capacitance to be generated in source-to-gate and drain-to-gate regions. These parasitic capacitances can have a direct impact on the speed of operation of the transistors. In particular, these parasitic capacitances can reduce the speed of operation of the transistors.

FIG. 1B shows an enlarged view of the left-side source-drain contact of the source-drain contact 120c. Referring to FIG. 1B, a depression is shown as being formed in the channel region 118c. It should be appreciated that depressions, such as that shown in channel region 118c, can be formed during etching and/or cleans operations. As shown in FIG. 1B, the first source-drain contact layer 121c of the left-side source-drain contact 120c extends into the channel region 118c. The extension of the source-drain contact layer 121c into the channel region 118c causes an undesirable parasitic overlap capacitance to be generated in the source-to-gate and the drain-to-gate regions. A description of some of the structures shown in FIG. 1B, previously described, is not made again here, for purposes of clarity brevity.

FIG. 2A illustrates a semiconductor structure 200 that includes transistors with raised source and drain contacts according to an embodiment. In the FIG. 2A embodiment, the semiconductor structure 200 includes dielectric layer 201, barrier layer 203, conductor layer 205, etch stop layer 207, conductor vias 209a-209c, spacers 211a-211d, isolation dielectric structures 213a-213d, gate electrodes 215a-215c, gate dielectric layers 217a-217c, channel regions 219a-219c, source-drain contacts 220a-220c, spacing structures 221a-221c, first source-drain contact layers 223a-223c, second source-drain contact layers 225a-225c, thin dielectric layers 227a-227c, ILD regions 229a-229c and sacrificial dielectric 231.

Referring to FIG. 2A, the dielectric layer 201 is shown at the base of the semiconductor structure 200. In an embodiment, the semiconductor structure 200 can include thin film transistors. In other embodiments, the semiconductor structure 200 can include other types of transistors. As shown in FIG. 2A, in an embodiment, the barrier layer 203 can be formed above the dielectric layer 201. The conductor layer 205 can be formed over the barrier layer 203. The etch stop layer 207 can be formed over the conductor layer 205. The conductor vias 209a-209c can be formed in the etch stop layer 207 and above the conductor layer 205. The gate electrodes 215a-215c can be formed above the etch stop layer 207 and above the conductor vias 209a-209c. The isolation dielectric structures 213a-213d can extend into the body of the transistor structure 200 between the gate electrodes 215a-215c and can be surrounded by the spacers 211a-211d. The gate dielectric layers 217a-217c can be formed above the gate electrodes 215a-215c. The channel regions 219a-219c can be formed above the gate dielectric layers 217a-217c. The thin dielectric layers 227a-227c can be formed above the channel regions 219a-219c and below portions of the ILD regions 229a-229c. In addition, the ILD regions 229a-229c can be formed between the source-drain contacts 220a-220c. In an embodiment, the thin dielectric layers 227a-227c can have a thickness of 1-3 nm. In other embodiments, the thin dielectric layers 227a-227c can have other thicknesses. The source-drain contacts 220a-220c can include spacing structures 221a-221c, first source-drain contact layers 223a-223c and second source-drain contact layers 225a-225c. The first source-drain contact layers 223a-223c can be formed over the spacing structures 221a-221c that are formed in the bottom of spaces formed in the ILD regions 229a-229c. In particular, the first source-drain contact layers 223a-223c can be formed on the spacing structures 221a-221c. The second source-drain contact layers 225a-225c can be formed on the first source-drain contact layers 223a-223c. In the FIG. 2A embodiment, the spacing structures 221a-221c can extend partially up the sides of spaces formed in the ILD regions 229a-229c and can be formed from a semiconductor oxide or insulator oxide (see description herein below). In other embodiments, the spacing structures 221a-221c can be formed from other materials. In an embodiment, the spacing structures 221a-221c can fill depressions in the surface of the channel (e.g., depressions formed in the surface of the channel material that can result from fabrication processes such as but not limited to etches and cleans). In an embodiment, the bottom surfaces of the first source-drain contact layers 223a-223c can be formed above the spacing structures 221a-221c formed on the surface of the channel. In this manner, the first source-drain contact layers 223a-223c and the second source-drain contact layers 225a-225c are prevented from extending below the intended top surface level of the channel material. In an embodiment, the spacing structures 221a-221c can include portions that extend partially up the sides of the source-drain contact trenches. In an embodiment, the spacing structures 221a-221c can extend a distance of 15 to 30 nm up the sides of the source-drain contact trenches. In other embodiments, the spacing structures 221a-221c can extend other distances up the sides of the source-drain contact trenches. For example, in some embodiments, the spacing structures 221a-221c can extend to cover the entire sides of the source-drain contact trenches. In an embodiment, the spacing structures 221a-221c can have a thickness of 1-5 nm. In other embodiments, the spacing structures 221a-221c can have other thicknesses. In an embodiment, the source-drain contacts 220a-220c can include a work function metal. In other embodiments, the source-drain contacts 220a-220c can include other types of materials and/or may not include a work function metal. In an embodiment, the source-drain contacts 220a-220c can include a plurality of layers of conductors. In other embodiments, the source-drain contacts 220a-220c can include a single conductor. In FIG. 2A, before removal, the sacrificial dielectric 231 is shown as being formed across the top of the semiconductor structure 200 above the source-drain contacts 220a-220c, the ILD regions 229a-229c and the isolation dielectric structures 213a-213d.

In an embodiment, the dielectric layer 201 can be formed from a low-k dielectric. In other embodiments, the dielectric layer 201 can be formed from other materials. In an embodiment, the barrier layer 203 can be formed from cobalt, ruthenium, tantalum, tantalum nitride, indium oxide, tungsten nitride, or titanium nitride. In other embodiments, the barrier layer 203 can be formed from other materials. In an embodiment, the conductor layer 205 can be formed from copper. In other embodiments, the conductor layer 205 can be formed from other materials. In an embodiment, etch stop layer 207 can be formed from silicon nitride. In other embodiments, the etch stop layer can be formed from other materials. In an embodiment, the conductor vias 209a-209c can be formed from TiN, W, or TaN. In other embodiments, the conductor vias 209a-209c can be formed from other materials. In an embodiment, the spacers 211a-211d can be formed from nitrides and/or oxides. In other embodiments, the spacers 211a-211d can be formed from other materials. In an embodiment, the isolation dielectric structures 213a-213d can be formed from silicon nitride. In other embodiments, the isolation dielectric structures 213a-213d can be formed from other materials. In an embodiment, the gate electrodes 215a-215c can be formed from TiN, W, or TaN. In other embodiments, the gate electrodes 215a-215c can be formed from other materials. In an embodiment, the gate dielectric layers 217a-217c can be formed from high-k oxide materials such as ZrOx, HfOx, AlOx or SiOx. In other embodiments, the gate dielectric layers 217a-217c can be formed from other materials. In an embodiment, the channel regions 219a-219c can be formed from a semiconductor oxide material (such as an adamantine film). In other embodiments, the channel regions 219a-219c can be formed from other materials. In an embodiment, the spacing structures 221a-221c can be formed from a semiconductor oxide or an insulator oxide. For example, in an embodiment, the spacing structures 221a-221c can be formed from AlOx, TiOx, HfOx, InOx, ZnOx, GaOx, RuOx, RuSiOx, IrOx, InZnOx, InZnGaOx, ZrOx, MnOx, CuOx, AgOx, MgOx, InSnOx, SnOx, or TaOx. In other embodiments, the spacing structures 221a-221c can be formed from other materials. In an embodiment, the first source-drain contact layers 223a-223c can be formed from a work function metal (for adhesion and thermal stability). In other embodiments the first source-drain contact layers 223a-223c can be formed from other materials. In an embodiment, second source-drain contact layers 225a-225c can be formed from TiN, W, or TaN. In other embodiments, the second source-drain contact layers 225a-225c can be formed from other materials. In an embodiment, the ILD regions 229a-229c can be formed from a nitride and/or oxide material. In other embodiment, the ILD regions 229a-229c can be formed from other materials. In an embodiment, the thin dielectric layers 227a-227c can be formed from an oxide. In other embodiments, the thin dielectric layers 227a-227c can be formed from other materials.

In operation, because the first source-drain contact layers 223a-223c and the second source-drain contact layers 225a-225c are prevented from extending into the channel regions 219a-219c, parasitic overlap capacitance is reduced in the source-to-gate and drain-to-gate regions. This reduction in parasitic capacitance has a direct impact on the speed of operation of the transistor. In particular, the reduced parasitic capacitance can operate to increase the speed of operation of the transistor.

FIG. 2B shows an enlarged view of the left-side source-drain contact of the source-drain contact 220c of FIG. 2A according to an embodiment. Referring to FIG. 2B, the spacing structure 221c is shown as filling a depression formed in the channel region 219c. It should be appreciated that depressions, such as that shown in FIG. 2B, can be formed during etching and/or cleans operations. As shown in FIG. 2B, the spacing structure 221c prevents the first source-drain contact layers 223c and the second source-drain contact layers 225c from extending into the channel regions 219c. This reduces parasitic overlap capacitance in the source-to-gate and the drain-to-gate regions. A description of some of the structures shown in FIG. 2B, previously described, is not made again here for purposes of clarity brevity.

Figure 3A:
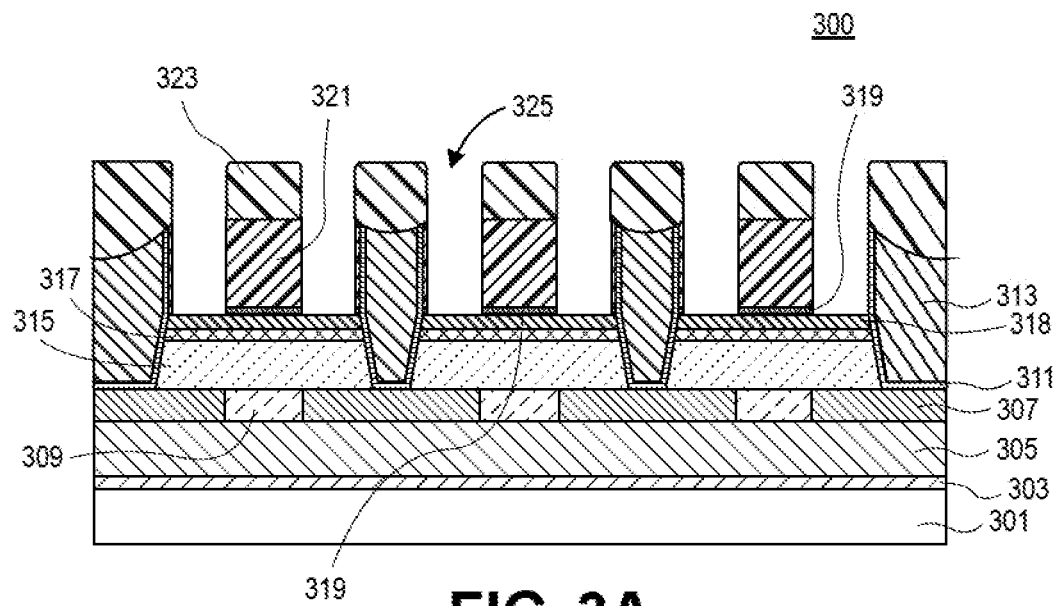
FIGS. 3A-3I illustrate cross-sections of a semiconductor structure at stages during the process of fabricating a semiconductor structure that includes thin film transistors with raised source and drain contacts according to an embodiment.

FIGS. 3A-3I shows cross-sections of a semiconductor structure at stages during the fabrication of a semiconductor structure that includes thin film transistors with raised source and drain contacts according to an embodiment. Referring to FIG. 3A, after a plurality of operations the semiconductor structure includes dielectric layer 301, barrier layer 303, conductor layer 305, etch stop layer 307, conductor via 309, spacer 311, isolation dielectric 313, gate electrode 315, gate dielectric 317, channel material 318, thin dielectric 319, ILD layer 321, low-k ILD layer 323 and spaces 325.

Figure 3B:
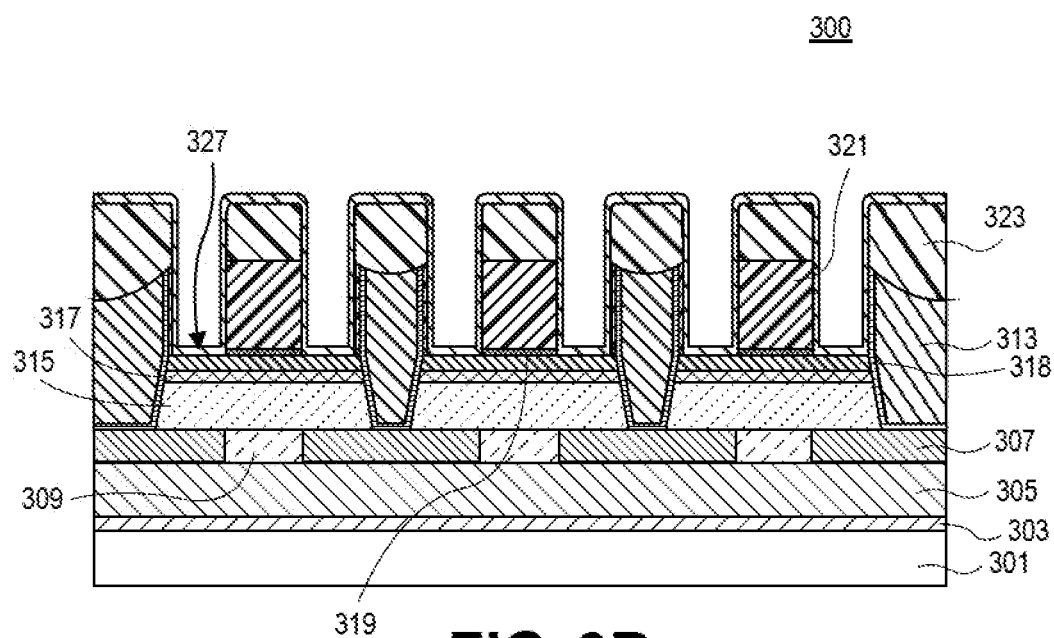

Referring to FIG. 3B, subsequent to one or more operations that result in a cross-section of the structure shown in FIG. 3A, spacing material 327 is formed in the spaces 325 that are formed in the semiconductor structure. In an embodiment, the spacing material 327 can be formed by atomic layer deposition (ALD), physical vapor deposition (PVD), chemical vapor deposition (CVD), electrochemical deposition (ECD), or molecular beam epitaxy (MBE).

Figure 3C:
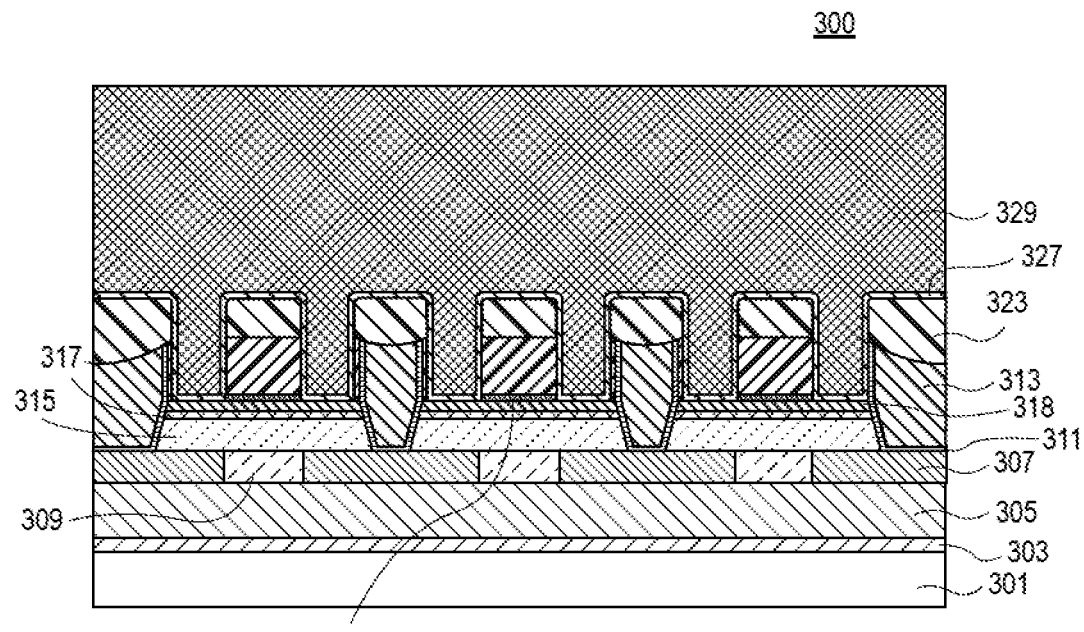

Referring to FIG. 3C, after one or more operations that result in the cross-section shown in FIG. 3B, a sacrificial dielectric material 329 is formed in the spaces defined by the spacing material 327. In an embodiment, the sacrificial dielectric material 329 can be formed by atomic layer deposition (ALD), physical vapor deposition (PVD), chemical vapor deposition (CVD), electrochemical deposition (ECD), or molecular beam epitaxy (MBE).

Figure 3D:
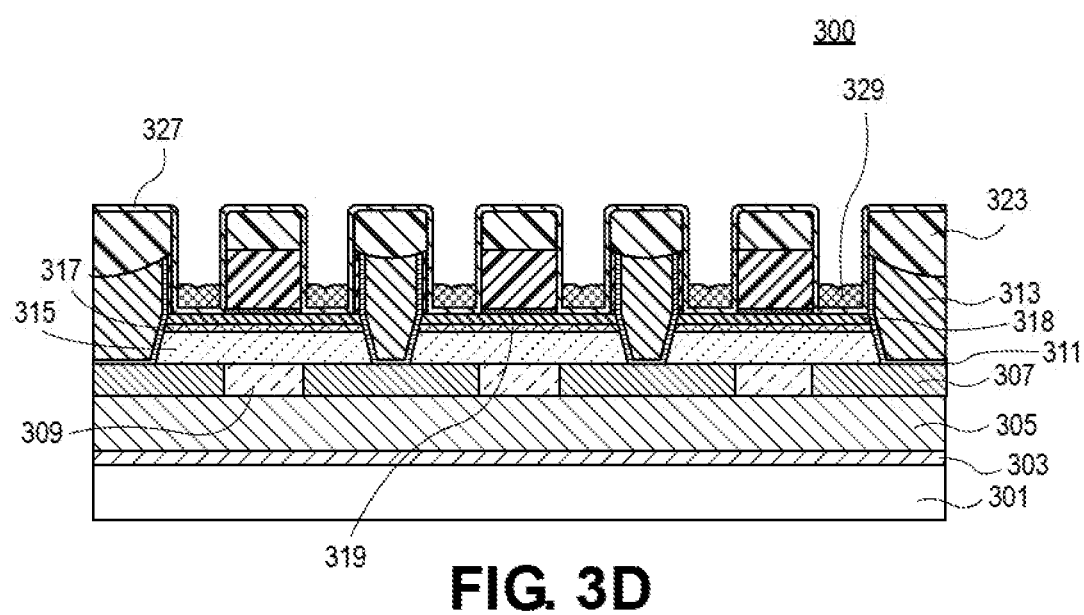

Referring to FIG. 3D, after one or more operations that result in a cross-section shown in FIG. 3C, the sacrificial dielectric material 329 is partially removed from the spaces to expose portions of the spacing material 327. In an embodiment, the sacrificial dielectric material 329 can be partially removed by isotropic, anisotropic, plasma etching, ion milling or sputter etching. In other embodiments, the sacrificial dielectric material 329 can be partially removed in other manners.

Figure 3E:
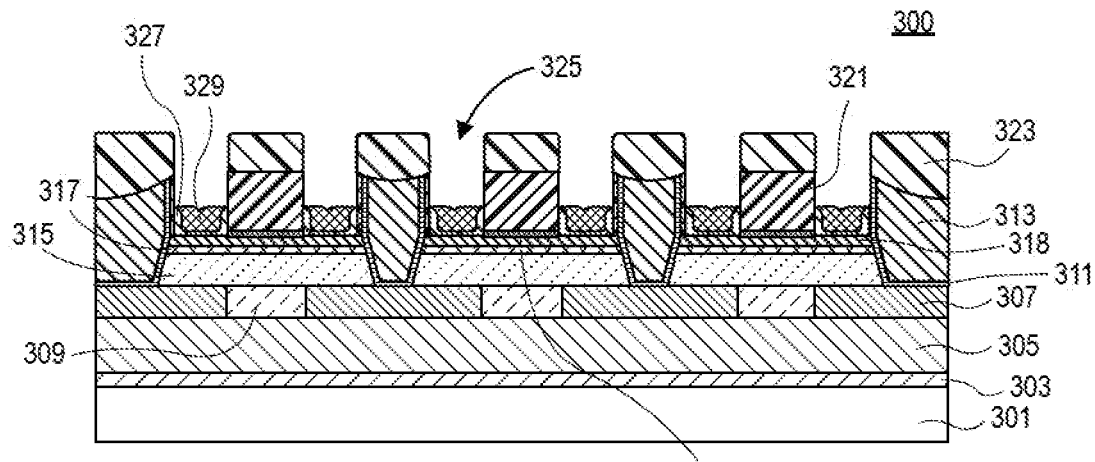

Referring to FIG. 3E, after one or more operations that result in a cross-section shown in FIG. 3D, the exposed portions of the spacing material 327 are removed. As part of these operations, the sacrificial dielectric material 329 covers the portions of the spacing material 327 that are not desired to be removed. In an embodiment, the exposed portions of spacing material 327 can be removed by isotropic, anisotropic, plasma etching, ion milling or sputter etching. In other embodiments, the exposed portions of the spacing material 327 can removed in other manners.

Figure 3F:
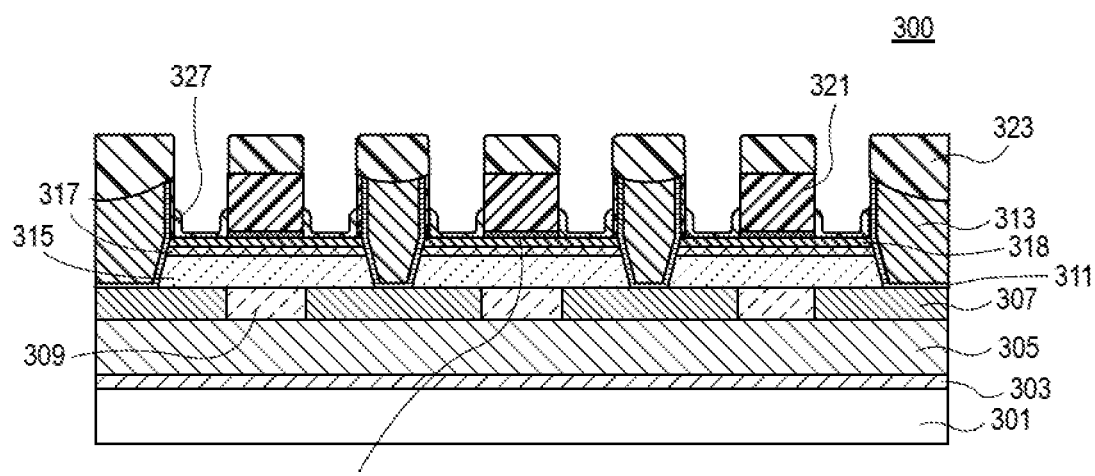

Referring to FIG. 3F, after one or more operations that result in the cross-section shown in FIG. 3E, the remaining portion of the sacrificial material 329 is removed. In an embodiment, the remaining portion of the sacrificial material 329 can be removed by isotropic, anisotropic, plasma etching, ion milling or sputter etching. In other embodiments, the remaining portion of the sacrificial material 329 can be removed in other manners.

Figure 3G:
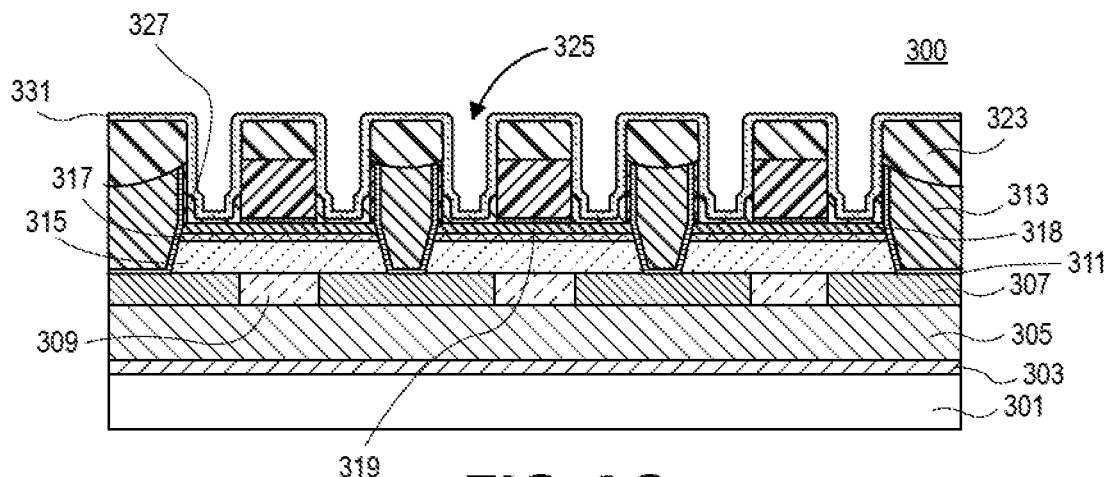

Referring to FIG. 3G, subsequent to one or more operations that result in the cross-section shown in FIG. 3F, a work function metal 331 with good adhesion and thermal stability is formed in the area defined by spaces 325 and remaining spacing material 327. In an embodiment, the work function metal 331 can be formed by atomic layer deposition (ALD), physical vapor deposition (PVD), chemical vapor deposition (CVD), electrochemical deposition (ECD), or molecular beam epitaxy (MBE). In other embodiments, the work function metal 331 can be formed in other manners. In other embodiments, a conductor other than a work function metal 331 can be formed in the area defined by spaces 325 and the remaining spacing material 327.

Figure 3H:
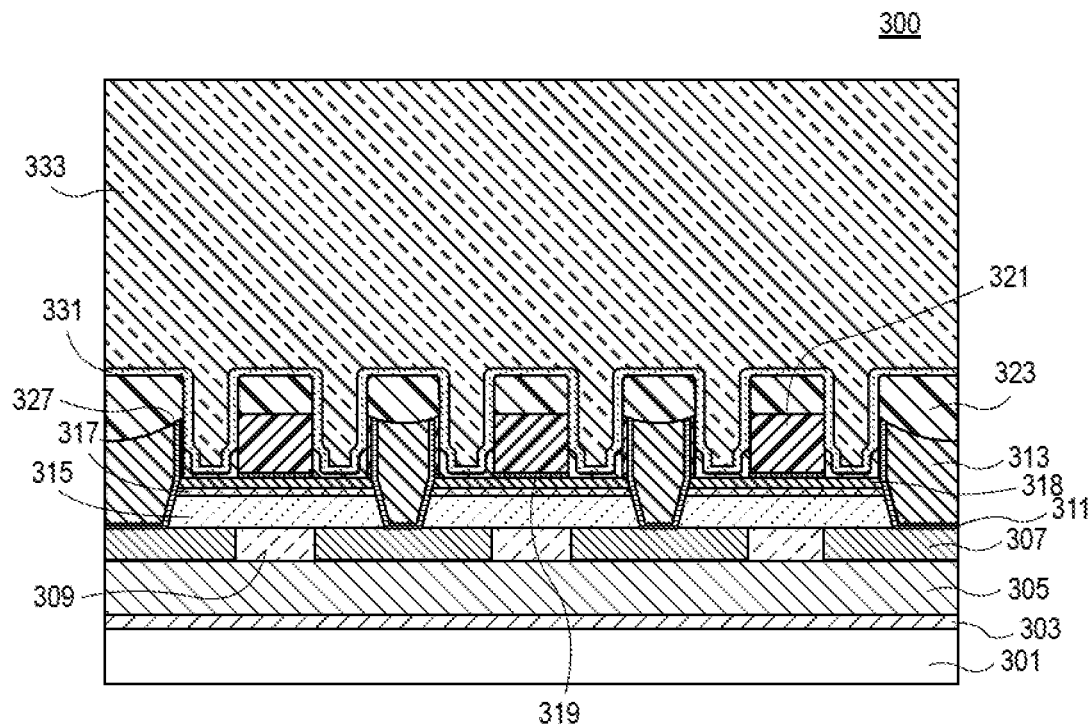

Referring to FIG. 3H, subsequent to one or more operations that result in the cross-section shown in FIG. 3G, a conductor 333 is formed on the top surface of the semiconductor structure 300. In an embodiment, the conductor 333 can be a bulk metal. In other embodiment, the conductor 333 can include other type conductors. In an embodiment, the conductor 333 can be a low resistance conductor. In an embodiment, the low resistance conductor can have a resistivity of $10^{-6}$ ohm-m to $10^{-8}$ ohm-m. In other embodiments, the low resistance conductor can have a resistivity that is in other ranges. In an embodiment, the conductor 333 can be formed by atomic layer deposition (ALD), physical vapor deposition (PVD), chemical vapor deposition (CVD), electrochemical deposition (ECD), or molecular beam epitaxy (MBE). In other embodiments, the conductor 333 can be formed in other manners.

Figure 3I:
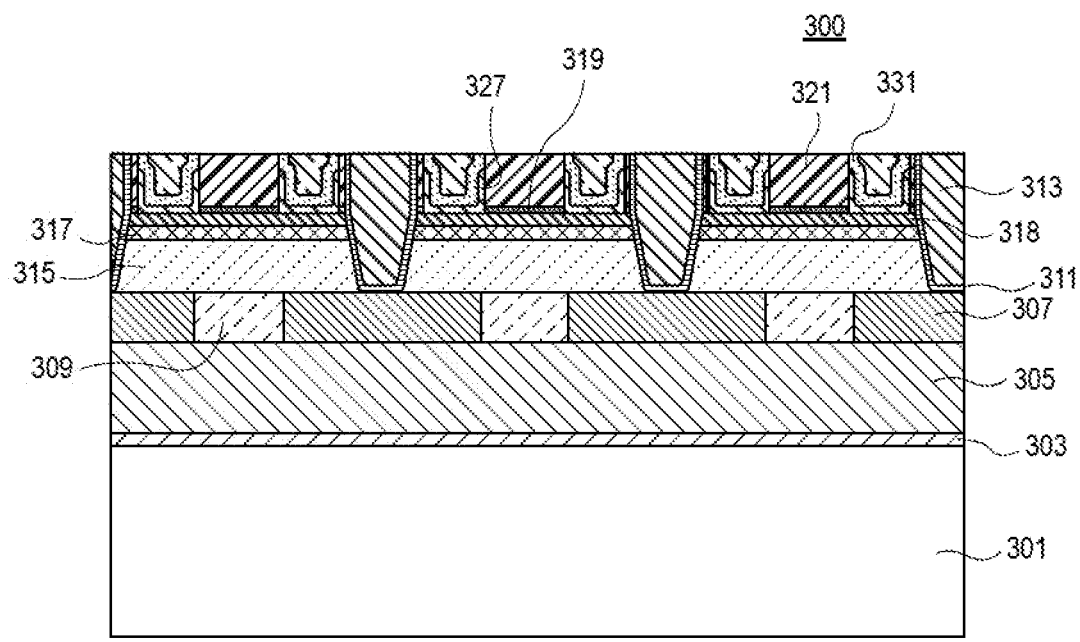

Referring to FIG. 3I, subsequent to one or more operations that result in the cross-section shown in FIG. 3H, a contact polish is performed. In an embodiment, the contact polish can be performed by chemical-mechanical-polishing (CMP). In other embodiments, the post contact polish can be performed in other manners.

Figure 4A:
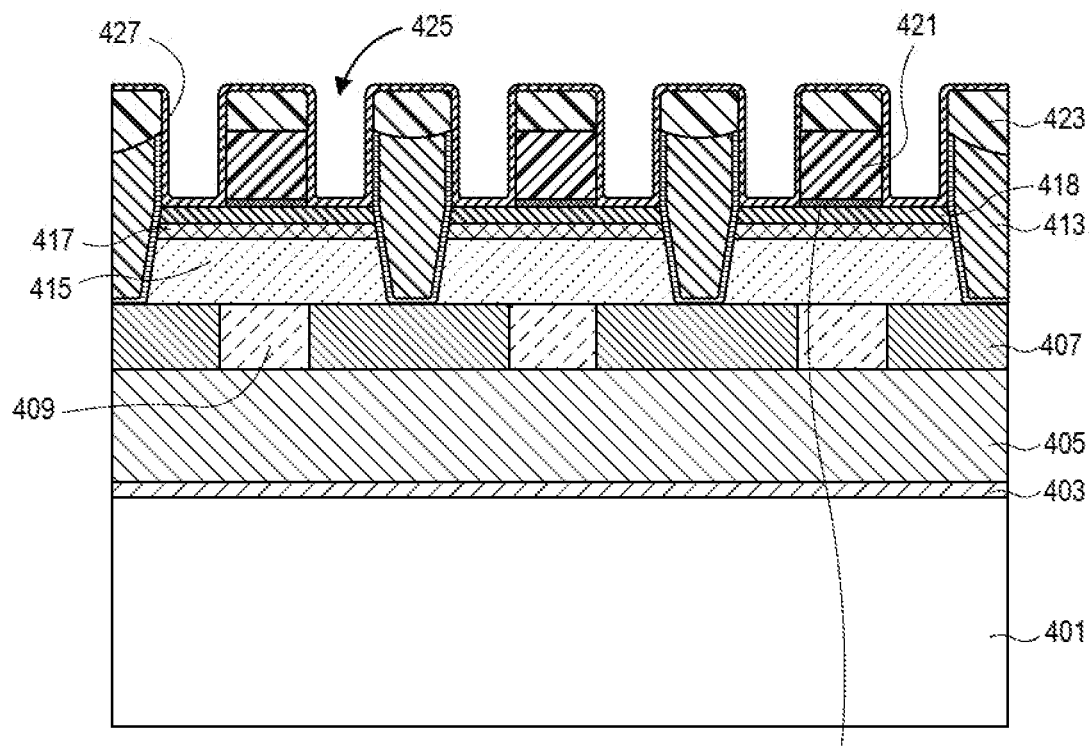
FIGS. 4A-4D illustrate cross-sections of a semiconductor structure at stages during the process of fabricating a semiconductor structure that includes thin film transistors with raised source and drain contacts according to an embodiment.

FIGS. 4A-4D shows cross-sections of a semiconductor structure at stages during the fabrication of a semiconductor structure that includes thin film transistors with raised source and drain contacts according to an embodiment. Referring to FIG. 4A, after a plurality of operations the semiconductor structure includes dielectric layer 401, barrier layer 403, conductor layer 405, etch stop layer 407, conductor via 409, spacer 411, isolation dielectric 413, gate electrode 415, gate dielectric 417, channel material 418, thin dielectric 419, ILD layer 421, low-k ILD layer 423, spaces 425 and vertical spacing material 427.

Figure 4B:
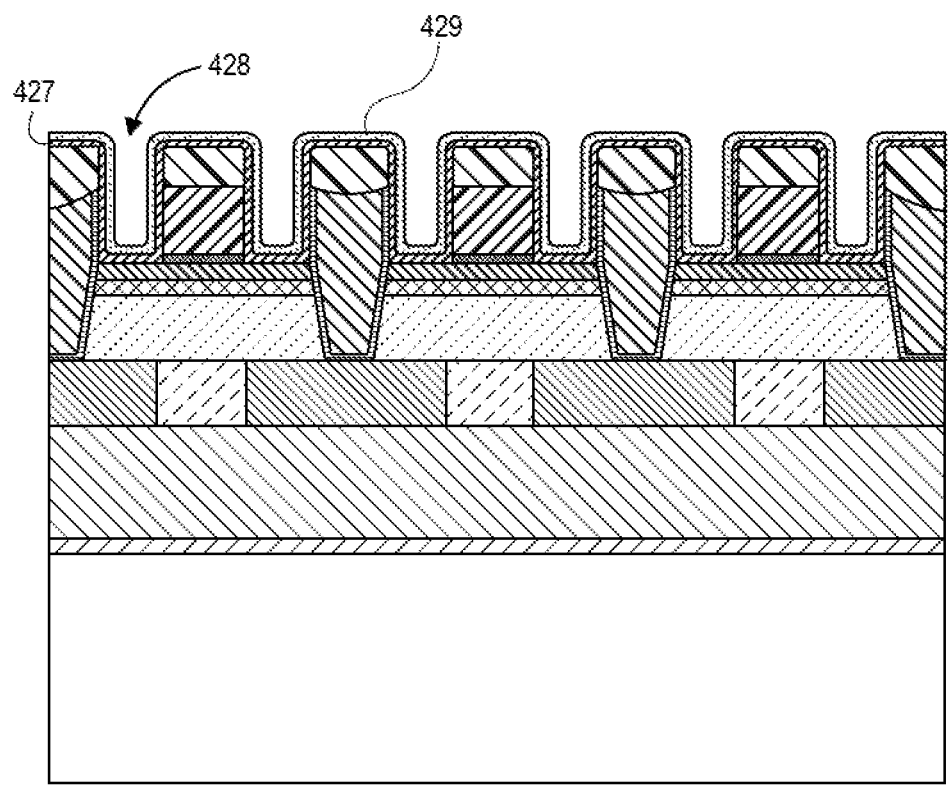

Referring to FIG. 4B, subsequent to one or more operations that result in the cross-section shown in FIG. 4A, a work function metal 429 with good adhesion and thermal stability is formed in the spaces 428 defined by vertical spacing material 427. In an embodiment, the work function metal 429 can be formed by atomic layer deposition (ALD), physical vapor deposition (PVD), chemical vapor deposition (CVD), electrochemical deposition (ECD), or molecular beam epitaxy (MBE). In other embodiments, the work function metal 429 can be formed in other manners. In other embodiments, a conductor other than a work function metal 429 can be formed in the spaces 428 defined by vertical spacing material 427.

Figure 4C:
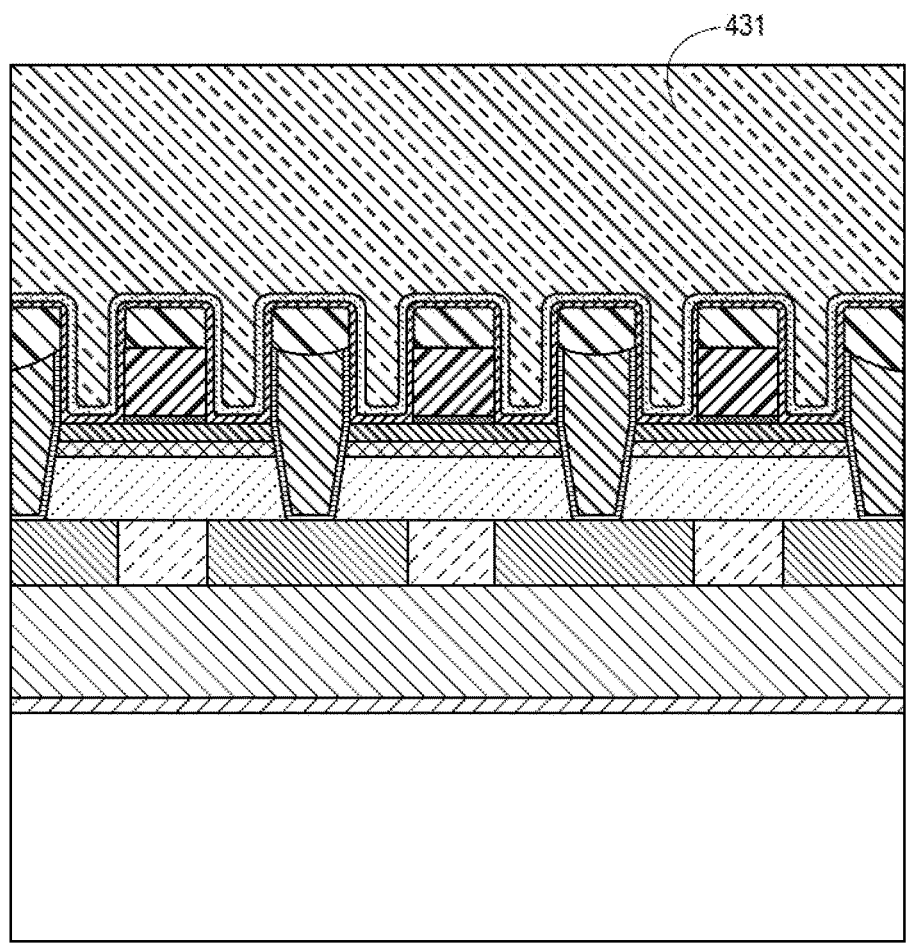

Referring to FIG. 4C, subsequent to one or more operations that result in the cross-section shown in FIG. 4B, a conductor 431 is formed on the top surface of the semiconductor structure. In an embodiment, the conductor 431 can be a bulk metal. In other embodiment, the conductor 431 can include other type conductors. In an embodiment, the conductor 431 can be a low resistance conductor. In an embodiment, the low resistance conductor can have a resistivity of $10^{-6}$ ohm-m to $10^{-8}$ ohm-m. In other embodiments, the low resistance conductor can have a resistance that is in other ranges. In an embodiment, the conductor 431 can be formed by atomic layer deposition (ALD), physical vapor deposition (PVD), chemical vapor deposition (CVD), electrochemical deposition (ECD), or molecular beam epitaxy (MBE). In other embodiments, the conductor 431 can be formed in other manners.

Figure 4D:
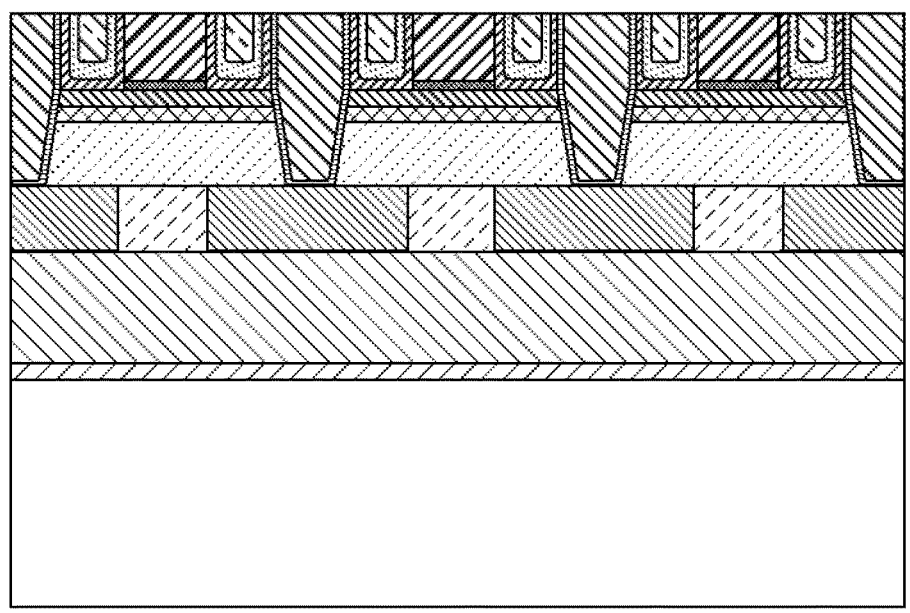

Referring to FIG. 4D, subsequent to one or more operations that result in the cross-section shown in FIG. 4C, a contact polish is performed. In an embodiment, the contact polish can be performed by chemical-mechanical-polishing (CMP). In other embodiments, the post contact polish can be performed in other manners.

Figure 5:
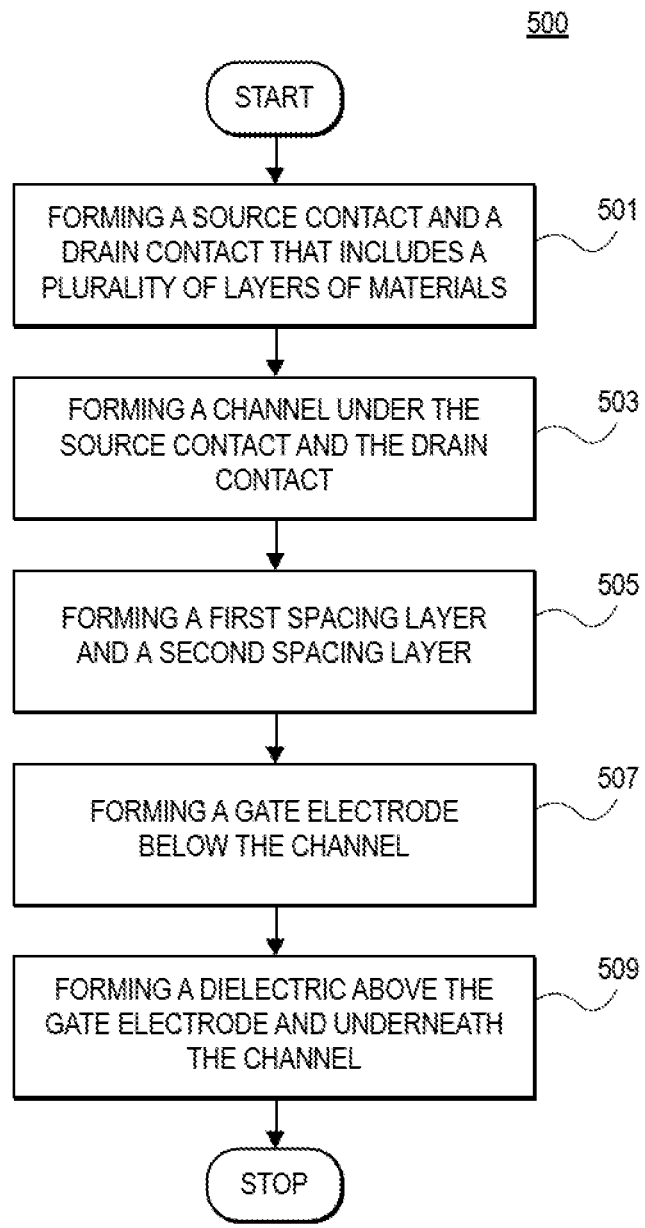
FIG. 5 illustrates a flowchart of a process of fabricating a thin film transistor with raised source and drain contacts according to an embodiment.

FIG. 5 illustrates a flowchart of a method for forming a transistor with raised source-drain contacts according to an embodiment. Referring to FIG. 5, the method includes, at 501, forming a source contact and a drain contact that includes a plurality of layers of materials. In other embodiments, the source contact and the drain contact can include a single material (a single material in addition to the spacing layer described herein). At 503, forming a channel under the source contact and the drain contact. At 505, forming a first spacing layer on a bottom of a source contact trench and a second spacing layer on a bottom of a drain contact trench. At 507, forming a gate electrode below the channel. At 509, forming a dielectric above the gate electrode and underneath the channel.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, or zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, or conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, or aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, or silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
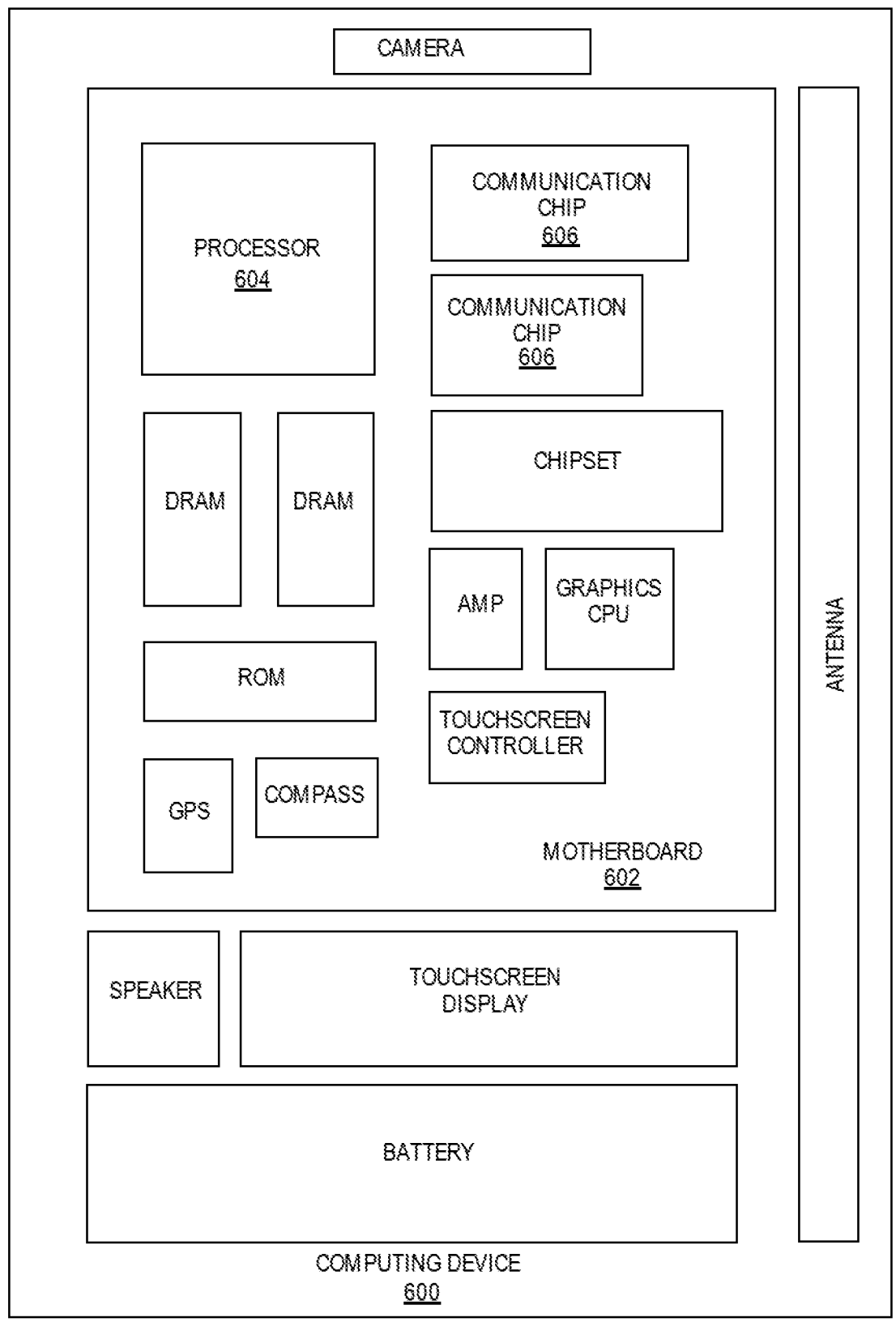
FIG. 6 illustrates a computing device in accordance with one implementation of an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, memory and or logic systems of computing device 600 (such as but not limited to DRAM and/or DRAM that is embedded in logic) can include devices such as transistors that are a part of the semiconductor structure 200 described herein with reference to FIG. 2.

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
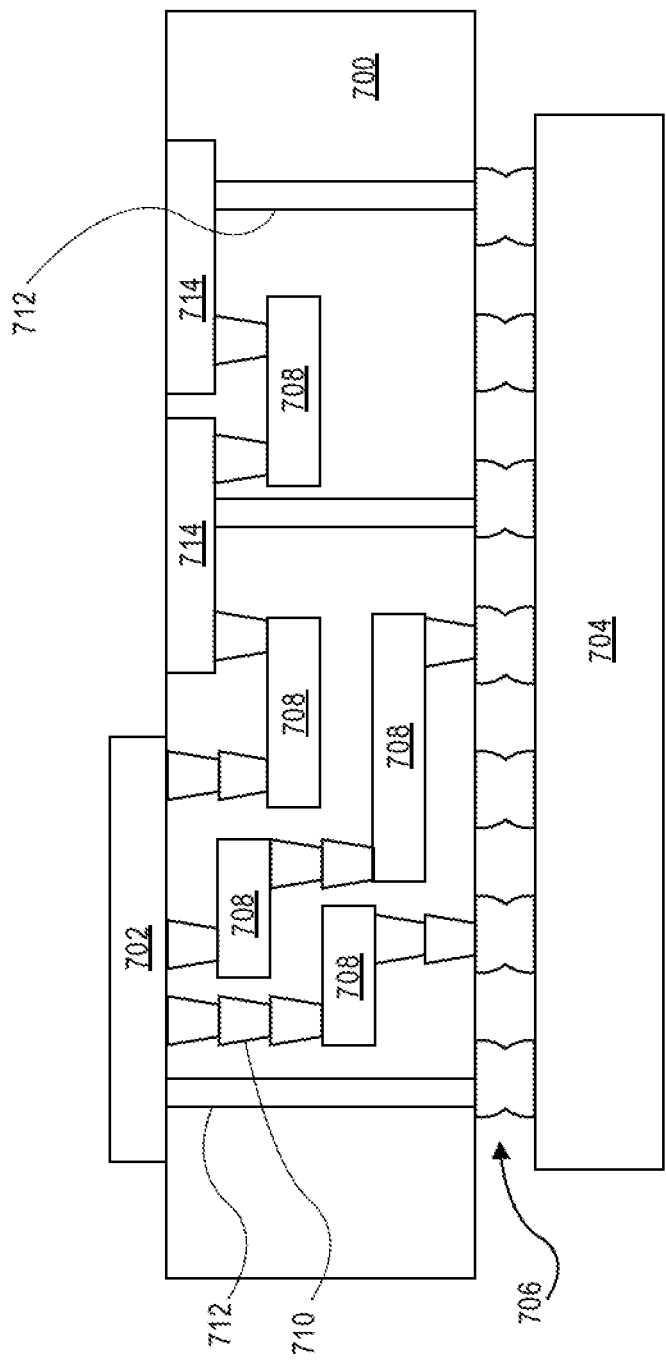
FIG. 7 illustrates an interposer that includes one or more embodiments.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1: A device, including a source contact in a source contact trench and a drain contact in a drain contact trench; a channel under the source contact and the drain contact; a first spacing layer on a bottom of the source contact trench and a second spacing layer on a bottom of the drain contact trench, wherein the first spacing layer and the second spacing layer are on a surface of the channel; a gate electrode below the channel; and a dielectric above the gate electrode and underneath the channel.

Example Embodiment 2: The device of example embodiment 1, wherein the first spacing layer and the second spacing layer fill any depression in the surface of the channel.

Example Embodiment 3: The device of example embodiment 1 or 2, wherein a bottom surface of the source contact and a bottom surface of the drain contact are above the first spacing layer and the second spacing layer, respectively, and above the surface of the channel.

Example Embodiment 4: The device of example embodiment 1, 2, or 3, wherein the first spacing layer and the second spacing layer include portions that extend partially up the sides of the source contact trench and partially up the sides of the drain contact trench.

Example Embodiment 5: The device of example embodiment 1, 2, 3, or 4, wherein the first spacing layer and the second spacing layer include a semiconductor.

Example Embodiment 6: The device of example embodiment 1, 2, 3, or 4, wherein the first spacing layer and the second spacing layer include an insulator.

Example Embodiment 7: The device of example embodiment 1, 2, 3, 4, 5, or 6, wherein the first spacing layer and the second spacing layer include oxide.

Example Embodiment 8: The device of example embodiment 1, 2, 3, 4, 5, 6, or 7 wherein the first spacing layer and the second spacing layer extend a distance of 15 to 30 nm up the sides of the source contact trench and the drain contact trench.

Example Embodiment 9: The device of example embodiment 1, 2, 3, 4, 5, 6, 7, or 8, wherein the thickness of the first spacing layer and the thickness of the second spacing layer is 1 to 5 nm.

Example Embodiment 10: The device of example embodiment 1, 2, 3, 4, 5, 6, 7, 8, or 9, wherein the source contact and the drain contact include a work function metal.

Example Embodiment 11: The device of example embodiment 1, 2, 3, 4, 5, 6, 7, 8, 9, or 10, wherein the source contact and the drain contact include a plurality of layers of conductors.

Example Embodiment 12: The device of example embodiment 1, 2, 3, 4, 5, 6, 7, 8, 9, or 10, wherein the source contact and the drain contact include a single conductor.

Example Embodiment 13: A device including a source contact and a drain contact in a source contact trench and a drain contact trench; a channel under the source contact and the drain contact; a first spacing layer on a bottom of the source contact trench and a second spacing layer on a bottom of the drain contact trench, wherein the first spacing layer and the second spacing layer are on the surface of the channel and line the sidewalls of the source contact trench and the drain contact trench; a gate electrode below the channel; and a dielectric above the gate electrode and underneath the channel.

Example Embodiment 14: The device of embodiment 13, wherein the first spacing layer and the second spacing layer fill any depression in the surface of the channel.

Example Embodiment 15: The device of embodiment 13 or 14, wherein a bottom surface of the source contact and a bottom surface of the drain contact are above the first spacing layer and the second spacing layer, respectively, and above the surface of the channel.

Example Embodiment 16: The device of embodiment 13, 14, or 15, wherein the first spacing layer and the second spacing layer is a semiconductor or an insulator.

Example Embodiment 17: A system, comprising: one or more processing components; and one or more data storage components, the data storage components including at least one transistor, the at least one transistor including: a source contact and a drain contact in a source contact trench and a drain contact trench; a channel under the source contact and the drain contact; a first spacing layer on a bottom of the source contact trench and a second spacing layer on a bottom of the drain contact trench, wherein the first spacing layer and the second spacing layer are on the surface of the channel; a gate electrode below the channel; and a dielectric above the gate electrode and underneath the channel.

Example Embodiment 18: The system of example embodiment 17, wherein the first spacing layer and the second spacing layer fill any depression in the surface of the channel.

Example Embodiment 19: The system of example embodiment 17 or 18, wherein a bottom surface of the source contact and a bottom surface of the drain contact are above the first spacing layer and the second spacing layer, respectively, and above the surface of the channel.

Example Embodiment 20: The system of example embodiment 17, 18, or 19, wherein the first spacing layer and the second spacing layer include portions that extend partially up the sides of the source contact trench and the drain contact trench.

Example Embodiment 21: A method including forming a source contact trench and a drain contact trench in dielectric material; forming a spacer material on a bottom and sidewalls of the source contact trench and on a bottom and sidewalls of the drain contact trench; forming sacrificial material above the spacer material; removing a part of the sacrificial material; removing parts of the spacer material exposed by the removal of part of the sacrificial material; forming a work function conductor above the remaining spacer material and on exposed sidewalls of the source contact trench and on exposed sidewalls of the drain contact trench to define spaces; and forming a conductor in the spaces.

Example Embodiment 22: The method of embodiment 21, wherein the spacer material fills any depression in the surface of a channel below the spacer material.

Example Embodiment 23: The method of example embodiment 21 or 22, wherein the forming the spacer material includes forming the spacer material to have a thickness of 1-5 nm.

Example Embodiment 24: The method of example embodiment 21, 22, or 23, wherein the spacer material is formed to extend a distance of 15 to 30 nm up the sides of the source contact trench and the drain contact trench.

Example Embodiment 25: The method of example embodiment 21, 22, 23, or 24, wherein the spacer material includes a semiconductor oxide or an insulator oxide.

Example Embodiment 26: A method, comprising: forming a source contact trench and a drain contact trench in dielectric material; forming a spacer material on a bottom and sidewalls of the source contact trench and on a bottom and sidewalls of the drain contact trench; forming a work function conductor above the spacer material on the bottom and the sidewalls of the source contact trench and the bottom and the sidewalls of the drain contact trench to define spaces; and forming a conductor in the spaces.

Example Embodiment 27: The method of example embodiment 26, wherein the spacer material fills any depression in the surface of a channel below the spacer material.

Example Embodiment 28: The method of example embodiment 26, or 27, wherein forming the spacer material includes forming the spacer material to have a thickness of 1-5 nm.

Example Embodiment 29: The method of example embodiment 26, 27, or 28, wherein the spacer material covers the entire sides of the source contact trench and the drain contact trench.

Example Embodiment 30: The method of example embodiment 26, 27, 28, or 29, wherein the spacer material includes a semiconductor oxide or an insulator oxide.

Example Embodiment 31: A method includes forming a source contact in a source contact trench and a drain contact in a drain contact trench; forming a channel under the source contact and the drain contact; forming a first spacing layer on a bottom of the source contact trench and a second spacing layer on a bottom of the drain contact trench, wherein the first spacing layer and the second spacing layer are on the surface of the channel; forming a gate electrode below the channel; and forming a dielectric above the gate electrode and underneath the channel.

Example Embodiment 32: The method of example embodiment 31, wherein the forming the first spacing layer and the second spacing layer includes filling any depression in the surface of the channel.

Example Embodiment 33: The method of example embodiment 31 or 32, wherein the bottom surfaces of the source contact and the drain contact are above the first spacing layer and the second spacing layer, respectively, and above the surface of the channel.

Example Embodiment 34: The method of example embodiment 31, 32, or 33, wherein the forming the first spacing layer and the second spacing layer includes forming the first spacing layer and the second spacing layer to include portions that extend partially up the sides of the source contact trench and the drain contact trench.

Example Embodiment 35: The method of example embodiment 31, 32, 33, or 34, wherein the first spacing layer and the second spacing layer include a semiconductor.

Example Embodiment 36: The method of example embodiment 31, 32, 33, 34, or 35, wherein the first spacing layer and the second spacing layer include an insulator.

Example Embodiment 37: The method of example embodiment 31, 32, 33, 34, 35, or 36, wherein the first spacing layer and the second spacing layer include an oxide.

Example Embodiment 38: The method of example embodiment 31, 32, 33, 34, 35, 36, or 37, wherein the forming the first spacing layer and the second spacing layer includes forming the first spacing layer and the second spacing layer to extend a distance of 15 to 30 nm up the sides of the source contact trench and the drain contact trench.

Example Embodiment 39: The method of example embodiment 31, 32, 33, 34, 35, 36, 37, or 38, wherein the thickness of the first spacing layer and the second spacing layer is 1-5 nm.

Example Embodiment 40: The method of example embodiment 31, 32, 33, 34, 35, 36, 37, 38, or 39, wherein the source contact and the drain contact includes a work function metal.

Example Embodiment 41: The method of example embodiment 31, 32, 33 34, 35, 36, 37, 38, 39, or 40, wherein the source contact and the drain contact include a plurality of layers of conductors.

Example Embodiment 42: The method of example embodiment 26, 27, 28, 29, 30, 31, 32, 33, 34, 35, or 36, wherein the source contact and the drain contact include a single conductor.

What is claimed is:

1. A device, comprising:
   a source contact in a source contact trench and a drain contact in a drain contact trench;
   a channel layer under the source contact and the drain contact, the channel layer having a first depression in a source region beneath the source contact, and the channel layer having a second depression in a drain region beneath the drain contact;
   a first spacing layer on a bottom of the source contact and in the first depression in the channel layer, and a second spacing layer on a bottom of the drain contact and in the second depression in the channel layer, wherein the first spacing layer and the second spacing layer are on a surface of the channel layer, each of the first spacing layer and the second spacing layer having a central deeper portion laterally between outer shallower portions, each of the source contact and the drain contact having an upper portion wider than a bottom portion in the respective source contact trench and the drain contact trench;
   a gate electrode below the channel layer;
   a dielectric above the gate electrode and underneath the channel layer; and
   wherein the first spacing layer and the second spacing layer extend a distance of 15 to 30 nm up along sides of the source contact trench and the drain contact trench.

2. The device of claim 1, wherein a bottom surface of the source contact and a bottom surface of the drain contact is above the first spacing layer and the second spacing layer, respectively, and above the surface of the channel layer.

3. The device of claim 1, wherein the first spacing layer and the second spacing layer include portions that extend partially up the sides of the source contact trench and partially up the sides of the drain contact trench.

4. The device of claim 1, wherein the first spacing layer and the second spacing layer include a semiconductor.

5. The device of claim 1, wherein the first spacing layer and the second spacing layer include an insulator.

6. The device of claim 1, wherein the first spacing layer and the second spacing layer include oxide.

7. The device of claim 1, wherein the thickness of the first spacing layer and the thickness of the second spacing layer is 1-5 nm.

8. The device of claim 1, wherein the source contact and the drain contact include a work function metal.

9. The device of claim 1, wherein the source contact and the drain contact include a plurality of layers of conductors.

10. The device of claim 1, wherein the source contact and the drain contact include a single conductor.

11. A device, comprising:
    a source contact and a drain contact in a source contact trench and a drain contact trench;
    a channel layer under the source contact and the drain contact, the channel layer having a first depression in a source region beneath the source contact, and the channel layer having a second depression in a drain region beneath the drain contact;
    a first spacing layer on a bottom of the source contact and in the first depression in the channel layer, and a second spacing layer on a bottom of the drain contact and in the second depression in the channel layer, wherein the first spacing layer and the second spacing layer are on a surface of the channel layer and line sidewalls of the source contact trench and the drain contact trench each of the first spacing layer and the second spacing layer having a central deeper portion laterally between outer shallower portions, each of the source contact and the drain contact having an upper portion wider than a bottom portion in the respective source contact trench and the drain contact trench;
    a gate electrode below the channel layer; and
    a dielectric above the gate electrode and underneath the channel layer; and
    wherein the first spacing layer and the second spacing layer extend a distance of 15 to 30 nm up along sides of the source contact trench and the drain contact trench.

12. The device of claim 11, wherein a bottom surface of the source contact and a bottom surface of the drain contact is above the first spacing layer and the second spacing layer, respectively, and above the surface of the channel layer.

13. The device of claim 11, wherein the first spacing layer and the second spacing layer is a semiconductor or an insulator.

* * * * *